(12) United States Patent
Jenkins et al.

(10) Patent No.: US 9,866,221 B2
(45) Date of Patent: Jan. 9, 2018

(54) TEST CIRCUIT TO ISOLATE HCI DEGRADATION

(71) Applicant: International Business Machines Corporation, Armonk, NY (US)

(72) Inventors: Keith A. Jenkins, Sleepy Hollow, NY (US); Barry P. Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/163,379

(22) Filed: May 24, 2016

(65) Prior Publication Data

US 2017/0346492 A1 Nov. 30, 2017

(51) Int. Cl.
| | |
|---|---|
| *H03L 7/00* | (2006.01) |
| *H03K 3/03* | (2006.01) |
| *H03K 5/133* | (2014.01) |
| *G01R 31/26* | (2014.01) |
| *G01R 31/317* | (2006.01) |

(52) U.S. Cl.
CPC ............ *H03L 7/00* (2013.01); *G01R 31/2621* (2013.01); *G01R 31/31727* (2013.01); *H03K 3/0315* (2013.01); *H03K 5/133* (2013.01)

(58) Field of Classification Search
CPC ..... H03L 7/00; H03L 7/06; H03L 7/08; H03L 7/081; H03L 7/0812; H03L 7/0814; H03L 7/0816; H03L 7/0818; H03L 7/085; H03L 7/091; H03L 7/093; H03L 7/097; H03L 7/10; H03L 7/101; H03L 7/24; H03L 1/00; H03K 5/133; H03K 5/135; H03K 5/15013; G01R 31/31725; G01R 31/31727; G01R 31/31905; G01R 31/31922; G01R 31/31926; G01R 31/3193; G01R 31/40
USPC .......................... 327/141, 156–158, 161–163
See application file for complete search history.

(56) References Cited

U.S. PATENT DOCUMENTS

| | | | |
|---|---|---|---|
| 5,625,288 | A | 4/1997 | Snyder et al. |
| 6,242,937 | B1 | 6/2001 | Lee et al. |
| 6,476,632 | B1 | 11/2002 | La Rosa et al. |
| 6,724,214 | B2 | 4/2004 | Manna et al. |

(Continued)

FOREIGN PATENT DOCUMENTS

KR      100711556 A      8/2006

*Primary Examiner* — Lincoln Donovan
*Assistant Examiner* — Diana J Cheng
(74) *Attorney, Agent, or Firm* — Cantor Colburn LLP; Vazken Alexanian (57) ABSTRACT

Embodiments are directed to a system for synchronizing switching events. The system includes a controller, a clock generator communicatively coupled to the controller and a delay chain communicatively coupled to the controller. The delay chain is configured to perform a plurality of delay chain switching events in response to an input to the delay chain. The controller is configured to initiate a synchronization phase that includes enabling the clock generator to provide as an input to the delay chain a clock generator output at a synchronization frequency, wherein the clock generator output passing through the delay chain synchronizes the plurality of delay chain switching events to occur at the synchronization frequency resulting in a frequency of an output of the delay chain being synchronized to the synchronization frequency of the clock generator output.

22 Claims, 7 Drawing Sheets

(56) References Cited

U.S. PATENT DOCUMENTS

| | | |
|---|---|---|
| 6,798,230 B1 | 9/2004 | Taylor et al. |
| 7,205,854 B2 | 4/2007 | Liu |
| 7,664,216 B2 * | 2/2010 | Schnarr ............... G11C 7/1051 375/376 |
| 8,108,159 B2 | 1/2012 | Yang et al. |
| 8,717,835 B2 * | 5/2014 | Ma ....................... G11C 7/222 327/141 |
| 2014/0176116 A1 | 6/2014 | Kumar et al. |

* cited by examiner

TEST CIRCUIT TO ISOLATE HCI DEGRADATION

BACKGROUND

The present disclosure relates in general to the non-destructive testing of performance degradation in electronic circuits and their components. More specifically, the present disclosure relates to systems and methodologies that efficiently and effectively isolate and distinguish hot carrier injection (HCI) degradation from bias temperature instability (BTI) degradation and other aging mechanisms using a disclosed stress-and-measure test sequence that synchronizes one or more ring oscillator circuits to a desired number of switching events independent of the stress protocol used to measure HCI degradation, and independent of the intrinsic frequency of each ring oscillator circuit.

Digital circuits in electronic systems such as computer processors, handheld electronic devices and digital cameras may include CMOS (complementary metal-oxide semiconductor) components such as n-channel field-effect-transistors (NFETs) and p-channel field-effect-transistors (PFETs) arranged in a complimentary fashion to perform logical functions. The electrical performance (e.g., operating speed, drive strength, etc.) of circuits that include NFET and PFET electronic components may change over time as a result of transistor aging mechanisms such as negative-bias temperature instability (NBTI), positive-bias temperature instability (PBTI) and hot-carrier injection (HCI). BTI degradation is a result of voltages applied to the FET gate, and HCI degradation occurs whenever the FET performs a switching operation. A general trend toward decreasing field-effect-transistor (FET) device geometries (e.g., gate length) has increased their vulnerability to aging mechanisms.

Test methodologies have been developed to measure or estimate the expected electrical performance degradation of FET circuit components when deployed in integrated circuits (ICs). Known testing methodologies use a stress-and-measure test sequence, wherein a stress related to a particular aging mechanism is applied to a circuit that includes FETs, and then performance characteristics of the FETs are measured and used to estimate and/or characterize the performance degradation that will result from the particular aging mechanism. Once characterized, the performance degradation of different implementations of the same general type of circuit may be compared in order to gain further insights on the expected impact of aging mechanisms on circuit performance.

A known stress-and-measure methodology to determine the rate of HCI degradation involves the use of a ring oscillator circuit. A typical ring oscillator circuit is formed from an odd number of inverters, NAND gates or equivalent logic elements (typically in the form of semiconductor devices) attached in a chain such that the output each logic element is fed to the input of the next logic element in the chain, and the last logic element is fed back to the first logic element to form a loop. The odd number of logic elements connected in series causes the ring oscillator output to oscillate between two voltage levels (e.g., an applied voltage potential and a ground potential) representing logical one (1) and logical zero (0). When used in a stress-and-measure testing configuration, a ring oscillator circuit may be subjected to an accelerating factor to accelerate a particular performance degradation, which can be measured, evaluated and compared with other ring oscillator circuits. For example, CMOS ICs experience HCI degradation whenever their semiconductor devices (e.g., FETs) experience switching events, and the switching event frequency depends on the applied stress voltage. The degradation is manifested in the decrease of the frequency of the ring oscillator. The degradation due to switching event frequency (i.e., HCI degradation) can be accelerated for purposes of testing by stressing the ring oscillator circuits with an accelerating factor such as the application of increasingly higher voltage stresses or the addition of increasingly greater loads between the ring oscillator stages.

Because ring oscillator circuits experience performance degradation from multiple aging mechanisms, it is important that the stress-and-measure sequence isolate and accurately analyze the performance degradation that results from a particular aging mechanism. For example, ring oscillator circuits experience both BTI degradation and HCI degradation. The above-described stress-and-measure sequences cannot distinguish HCI degradation from BTI degradation and other aging mechanisms. The type of logic element used to form the ring oscillator circuit also impacts the ring oscillator frequency. For example, a ring oscillator formed from NANDs has a different frequency than a ring oscillator formed from inverters. Because HCI degradation depends on the switching event frequency, a stress that distorts the intrinsic frequency can also distort the observed HCI degradation, which makes it difficult to directly compare the observed HCI degradation of two ring oscillator circuits that use, for example, different drive voltage levels in their stress-and-measure sequences, or that used different logic circuit configurations. Additionally, because the amount of BTI degradation in FETs depends on the duty cycle (i.e., on/off times) of the applied gate voltage, the isolation of HCI degradation from BTI degradation would be enhanced by using a stress-and-measure sequence that does not does not significantly impact the duty cycles of the various stress signals.

Accordingly, it would be beneficial to provide systems and methodologies that efficiently and effectively isolate HCI degradation from BTI degradation and other aging mechanisms independent of the stress protocol used to measure HCI degradation, and independent of the intrinsic frequency of each ring oscillator circuit.

BRIEF SUMMARY

Embodiments are directed to a system for synchronizing switching events. The system includes a controller, a clock generator communicatively coupled to the controller and a delay chain communicatively coupled to the controller. The delay chain is configured to perform a plurality of delay chain switching events in response to an input to the delay chain. The controller is configured to initiate a synchronization phase that includes enabling the clock generator to provide as an input to the delay chain a clock generator output at a synchronization frequency, wherein the clock generator output passing through the delay chain synchronizes the plurality of delay chain switching events to occur at the synchronization frequency resulting in a frequency of an output of the delay chain being synchronized to the synchronization frequency of the clock generator output.

Embodiments are further directed to a system for synchronizing switching events. The system includes a controller, a clock generator communicatively coupled to the controller and a delay chain communicatively coupled to the controller. The first delay chain is configured to perform a plurality of delay chain switching events in response to an input to the delay chain. The controller is configured to initiate a synchronization phase that includes enabling the clock generator to provide as an input to the delay chain a clock generator output at a synchronization frequency and a synchronization duty cycle, wherein the clock generator output passing through the delay chain synchronizes the plurality of delay chain switching events to occur at the synchronization frequency and the synchronization duty cycle resulting in a frequency of the delay chain and a duty cycle of the delay chain being synchronized to the synchronization frequency and the synchronization duty cycle of the clock generator output.

Embodiments are further directed to a system for synchronizing switching events. The system includes a controller, a clock generator communicatively coupled to the controller and a delay chain communicatively coupled to the controller. The delay chain is configured to perform a plurality of delay chain switching events in response to an input to the delay chain. The controller is configured to initiate a synchronization phase that includes enabling the clock generator to provide as an input to the delay chain a clock generator output at a synchronization frequency and a synchronization duty cycle, wherein the clock generator output passing through the delay chain synchronizes the plurality of delay chain switching events to occur at the synchronization frequency and the synchronization duty cycle resulting in a frequency of the delay chain and a duty cycle of the delay chain being synchronized to the synchronization frequency of the clock generator output and the synchronization duty cycle of the clock generator output, wherein the clock generator output is provided to the first delay chain for a duration that is sufficient to stress the second delay chain, and wherein, prior to the synchronization phase, a frequency of the plurality of delay chain switching events is less than the synchronization frequency.

Embodiments are further directed to a method for synchronizing switching events. The method includes initiating, using a controller, a synchronization phase that includes enabling a clock generator to provide to a delay chain a clock generator output at a synchronization frequency, wherein the clock generator output passing through the delay chain synchronizes a plurality of delay chain switching events to occur at the synchronization frequency resulting in a frequency of the delay chain being synchronized to the synchronization frequency of the clock generator output.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. It is noted that alternative embodiments may be devised without departing from the scope of this disclosure. Various connections and relationships are set forth between elements in the following description and in the drawings. These connections and relationships, unless specified otherwise, may be direct or indirect, and the present disclosure is not intended to be limiting in this respect. Accordingly, a coupling of entities may refer to either a direct or an indirect connection. Additionally, an operation that is performed subsequently with respect to a preceding operation may or may not involve one or more intermediate operations between the preceding operation and the subsequent operation.

Turning now to an overview of the present disclosure, one or more embodiments provide systems and methodologies that efficiently and effectively distinguish HCI degradation from BTI degradation and other aging mechanisms using a stress-and-measure test sequence that utilizes a clock generator to synchronize one or more delay chain circuits to a desired number of switching events. In one or more embodiments, the clock signal that is used to synchronize the one or more delay chains is also applied for a sufficient duration to stress and cause a desired degradation (e.g., HCI degradation) of the one or more delay chains. However, the synchronization is independent of the stress protocol used to measure degradation, and is independent of the intrinsic frequency of each ring oscillator circuit.

A system according to one or more embodiments of the present disclosure provides a controller coupled to a clock generator and one or more delay chain circuits. The controller is configured to control the clock generator and the one or more delay chains to operate according to a synchronization/stress (sync/stress) phase, a reconfiguration phase and a measurement phase. In the sync/stress phase, the controller enables the clock generator to begin generating a clock output having a clock frequency and a clock duty cycle. The controller is further configured to couple the clock output to each of the one or more delay chains for a sufficient duration to stress and cause a desired HCI degradation of the one or more delay chains. Each delay chain includes a plurality of stages or gates coupled together one after another in a chain. Each gate in the delay chain exhibits gate delay because in a physical device no gate can perform its switching event instantaneously. For example, in a delay chain having a chain of inverters formed from MOSFETs, the gate capacitance must be charged before current can flow between the source and the drain. Thus, the output of every inverter stage changes a finite amount of time after the input has changed. Because delay chains are not limited in their frequency, passing the clock output through the delay chains synchronizes the frequency and/or the duty cycle of the delay chain switching events to match the frequency and/or the duty cycle of the clock output. Additionally, because the clock output is applied to the delay chains for a sufficient duration to stress and cause a desired HCI degradation of the delay chains, the clock output is also utilized as the stress stage of a stress-and-measure protocol. Accordingly, in the disclosed sync/stress phase, the same BTI degradation is common to the clock generator and the synchronized delay chains, which allows the HCI degradation in the delay chains to be substantially isolated and measured using the disclosed reconfiguration phase and measurement phase.

After the sync/stress phase has stressed the delay chains and synchronized the frequency and/or the duty cycle of the delay chain switching events to match the frequency and/or the duty cycle of the clock output, the controller switches to a reconfiguration phase, wherein the controller reconfigures the delay chains to function as ring oscillators. The reconfiguration may be accomplished by the controller coupling the output of each delay chain back to the input of the delay chain in order to establish the necessary feedback loop for oscillation. After the controller has, in the reconfiguration phase, reconfigured the delay chains to function as ring oscillators, the controller initiates a measurement phase. It is noted that after the delay chains have been reconfigured as ring oscillators, each ring oscillator now oscillates independently of the clock frequency and the clock duty cycle. More specifically, each ring oscillator oscillates at its own natural frequency which is determined by the characteristics of the devices that form the ring oscillator. When operated as a delay chain with the clock generator driving it, the frequency of the delay chain is the same as the synchronization frequency. However, when the delay chain is reconfigured as a ring oscillator, the frequency of the ring oscillator is determined by the devices that make up the ring oscillator. Thus, the ring oscillators run at their own post-sync/stress intrinsic frequencies, which are affected during the course of many stress-and-measure cycles, by each ring oscillator's degradation. Because of the accumulated degradation that occurs in the ring oscillators over many stress-and-measure cycles, HCI degradation in the ring oscillators becomes substantially isolated from BTI degradation and other aging mechanisms, and HCI degradation can be measured independent of the stress protocol used to create HCI degradation, and independent of the pre-sync/stress intrinsic switching event frequency (i.e., the switching event frequency prior to the sync/stress phase) of each ring oscillator circuit. In one or more embodiments, the measurement phase measures the post-sync/stress frequency of each ring oscillator, and then compares the post-sync/stress frequency to the pre-sync/stress frequency to determine a change in frequency that resulted from the applied stress. It is this change in frequency that provides the measured degradation in each ring oscillator due to stress. Accordingly, the accumulated degradation over many stress-and-measure cycles according to the present disclosure enables the extraction of the HCI degradation against a background environment in which the BTI degradation is substantially constant.

In one or more embodiments, the sync/stress duration is generally significantly longer than the measurement duration because the time that is required to degrade the delay chains/ring oscillators is greater than the time that is required to measure the ring oscillator frequencies. In one or more embodiments the disclosed sync/stress, reconfiguration and measurement phases are repeated multiple times. The sync/stress duration may be increased exponentially with each repetition of the three (3) disclosed phases so that the logarithm of each sync/stress interval is equal. The earliest sync/stress durations may, therefore, be relatively short, but by the end of the entire stress-and-measure sequence, the sync/stress durations may be comparatively quite long. The measurement duration, however, may be kept constant for each repetition of the disclosed stress-and-measure sequence (i.e., the sync/stress, reconfiguration and measurement phases).

In one or more embodiments, the clock generator has a faster frequency than the intrinsic switching event frequency of the delay chains when they are configured as ring oscillators. In one or more embodiments, the clock generator may be implemented as a lead ring oscillator, and the controller may be implemented as a configuration of logic elements. The downstream delay chains/ring oscillators are referred to herein as "follow" ring oscillators. For embodiments wherein the lead ring oscillator is made of delay components similar to those of the delay chains/ring oscillators, frequency changes in the lead ring oscillator may also be measured in order to determine the degradation in the lead ring oscillator. Acceleration factors may be applied to the lead and/or follow ring oscillators during the sync/stress phase to accelerate the degradation. For example, if voltage acceleration is desired, the lead ring oscillator voltage is set at a higher magnitude than the follow ring oscillators. If capacitive loading acceleration is desired, the lead ring master ring oscillator has the lowest inter-stage capacitance. Also, different logic elements can be used in the delay chains (i.e., the follow ring oscillators) to identify the differing effects of the logic element design choice on HCI degradation.

Figure 1:
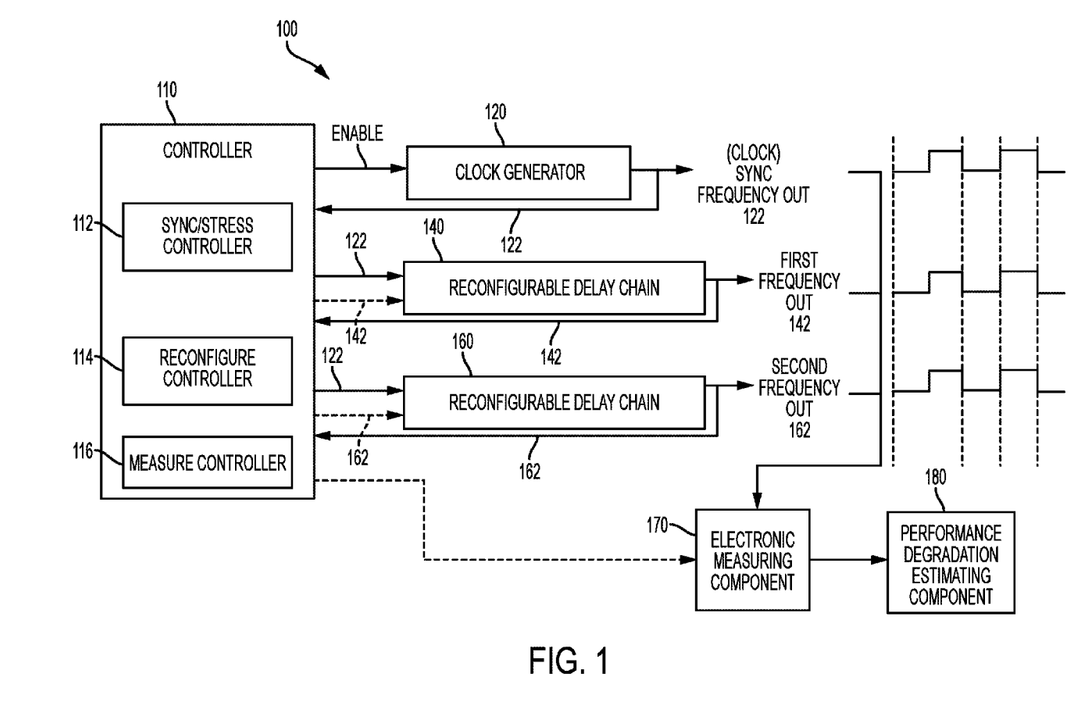
FIG. 1 depicts a block diagram of a system according to one or more embodiments.

Turning now to a more detailed description of the present disclosure, FIG. 1 depicts a block diagram of a system 100 according to one or more embodiments. As shown in FIG. 1, system 100 includes a controller 110, a clock generator 120, a first reconfigurable delay chain 140, a second reconfigurable delay chain 160, an electronic measuring component 170 and a performance degradation estimating component 180, configured and arranged as shown. For ease of illustration, only first and second reconfigurable delay chains 140, 160 are shown. However any number of reconfigurable delay chains may be provided. Controller 110 includes a synchronization/stress (sync/stress) controller 112, a reconfigure controller 114 and a measure controller 116.

In operation, controller 110 initiates a sync/stress phase in which sync/stress controller 112 enables clock generator 120 to generate clock output 122, which is coupled back to controller 110. Controller 110, using sync/stress controller 112, routes clock output 122 to downstream first and second reconfigurable delay chains 140, 160 for a sufficient duration to stress and cause a desired HCI degradation of first and second reconfigurable delay chains 140, 160. Because controller 110 does not couple first and second frequency outs 142, 162 as inputs to first and second reconfigurable delay chains 140, 160, first and second reconfigurable delay chains 140, 160 are configured during the sync/stress phase as delay chains. As delay chains, first and second reconfigurable delay chains 140, 160 are not limited in their frequency, and passing clock output 122 through first and second reconfigurable delay chains 140, 160 synchronizes the frequency and/or the duty cycle of first and second reconfigurable delay chains 140, 160 such that their switching event frequency and duty cycle match the frequency and the duty cycle of clock output 122. Thus, first frequency out 142 and second frequency out 162 also match the frequency and duty cycle of clock output 122. Additionally, because clock output 122 is applied to first and second reconfigurable the delay chains 140, 160 for a sufficient duration to stress and cause a desired HCI degradation of first and second reconfigurable delay chains 140, 160, clock output 122 is also utilized as the stress stage of a stress-and-measure protocol. Accordingly, at the end of the disclosed sync/stress phase, the same BTI degradation is common to clock generator 120 and first and second reconfigurable delay chains 140, 160, which allows the HCI degradation in first and second reconfigurable delay chains 140, 160 to be substantially isolated and measured using the disclosed reconfiguration phase and stress phase.

After the sync/stress phase has stressed first and second reconfigurable delay chains 140, 160, and also synchronized the frequency and/or the duty cycle of first and second frequency out 142, 162, controller 110 switches to a reconfiguration phase, wherein controller 110, using reconfigure controller 114, reconfigures first and second reconfigurable delay chains 140, 160 to function as ring oscillators. The reconfiguration may be accomplished by controller 110, using reconfigure controller 114, coupling first and second frequency outputs 142, 162 back to the inputs of first and second reconfigurable delay chains 140, 160 in order to establish the necessary feedback loop for oscillation.

After controller 110 and reconfigure controller 114 have reconfigured first and second reconfigurable delay chains 140, 160 to function as first and second ring oscillators 140, 160, controller 110 and measurement controller 116 initiate a measurement phase. It is noted that after first and second reconfigurable delay chains 140, 160 have been reconfigured as first and second ring oscillators 140, 160, each ring oscillator now oscillates independently of the frequency and the duty cycle of clock output 122. More specifically, each ring oscillator oscillates at its own natural frequency which is determined by the characteristics of the devices that form first and second ring oscillators 140, 160. Thus, first and second ring oscillators 140, 160 run at their own post-sync/stress intrinsic frequencies, which are affected during the course of many stress-and-measure cycles, by each ring oscillator's degradation. Because of the accumulated degradation that occurs in first and second ring oscillators 140, 160 over many stress-and-measure cycles, HCI degradation in first and second ring oscillators 140, 160 becomes substantially isolated from BTI degradation and other aging mechanisms, and HCI degradation can be measured substantially independent of the stress protocol used to create HCI degradation, and substantially independent of the intrinsic switching event frequency (i.e., the switching event frequency prior to synchronization) of each ring oscillator 140, 160.

First and second frequency outs 142, 162 are measured by electronic measuring component 170 and can be further processed by performance degradation estimating component 180. Optionally, the operation of electronic measuring component 170 may be controlled by controller 110 using measure controller 116 of controller 110. In one or more embodiments, the measurement phase measures the post-sync/stress frequency of each of first and second ring oscillators 140, 160, and then performance degradation estimating component 180 compares the post-sync/stress frequency to the pre-sync/stress frequency to determine a change in frequency that resulted from the applied stress. It is this change in frequency that provides the measured degradation in each of first and second ring oscillators 140, 160 due to stress. Accordingly, the accumulated degradation over many stress-and-measure cycles according to the present disclosure enables the extraction of the HCI degradation against a background environment in which the BTI degradation is substantially constant.

In one or more embodiments, the sync/stress duration is generally significantly longer than the measurement duration because the time that is required to degrade first and second reconfigurable delay chains 140, 160 delay chains is greater than the time that is required to measure first and second ring oscillators 140, 160 frequencies. In one or more embodiments the disclosed sync/stress, reconfiguration and measurement phases are repeated multiple times. The sync/stress duration may be increased exponentially with each repetition of the three (3) disclosed phases so that the logarithm of each sync/stress interval is equal. The earliest sync/stress durations may, therefore be relatively short, but by the end of the entire stress-and-measure sequence, the sync/stress durations may be comparatively quite long. The measurement duration, however, may be kept constant for each repetition of the disclosed stress-and-measure sequence (i.e., the sync/stress, reconfiguration and measurement phases).

Figure 2:
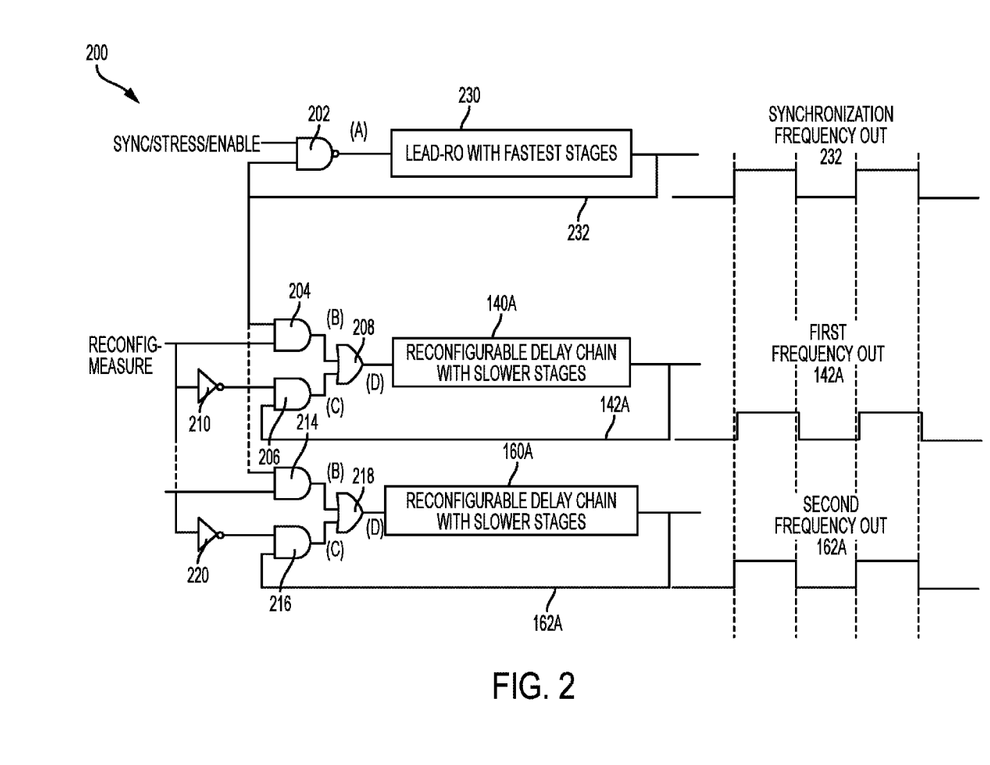
FIG. 2 depicts a schematic diagram of a system according to one or more embodiments.

In one or more embodiments, clock generator 110 has a faster frequency than the intrinsic switching event frequency of first and second reconfigurable delay chains 140, 160. In one or more embodiments (e.g., as shown in FIG. 2), clock generator may be implemented as a lead ring oscillator. For embodiments wherein the lead ring oscillator is made of delay components similar to those of first and second reconfigurable delay chains 140, 160, frequency changes in the lead ring oscillator may also be measured in order to determine the HCI degradation in the lead ring oscillator. Acceleration factors may be applied to first and second ring oscillators 140, 160 during the sync/stress phase to accelerate the HCI degradation, or may be built into first and second ring oscillators 140, 160 by design. For example, if voltage acceleration is desired, the lead ring oscillator voltage is set at a higher magnitude than the follow ring oscillators. If capacitive loading acceleration is desired, the lead ring master ring oscillator has the lowest inter-stage capacitance. Also, different logic elements can be used in the delay chains (i.e., the follow ring oscillators) to identify the differing effects of the logic element design choice on HCI degradation.

FIG. 2 depicts a schematic diagram of a system 200 according to one or more embodiments. System 200 is a non-limiting example of how system 100 shown in FIG. 1 may be implemented. Referring now to FIG. 1 and FIG. 2, controller 110 may be implemented by a configuration of logic elements including NAND 202, AND 204, AND 206, OR 208, inverter 210, AND 214, AND 216, OR 218 and inverter 220, configured and arranged as shown. More specifically, sync/stress controller 112 may be implemented as NAND 202, and reconfigure controller 114 and measure controller 116 may be implemented as AND 204, AND 206, OR 208, inverter 210, AND 214, AND 216, OR 218 and inverter 220. Clock generator 120 may be implemented as a lead-ring oscillator (lead-RO) 230. First reconfigurable delay chain 140 is substantially the same as first reconfigurable delay chain 140A, and second reconfigurable delay chain 160 is substantially the same as second reconfigurable delay chain 160A. Clock output 122 is substantially the same as sync/stress frequency out 232, first frequency out 142 is substantially the same as first frequency out 142A, and second frequency out 162 is substantially the same as second frequency out 162A.

Figure 3:
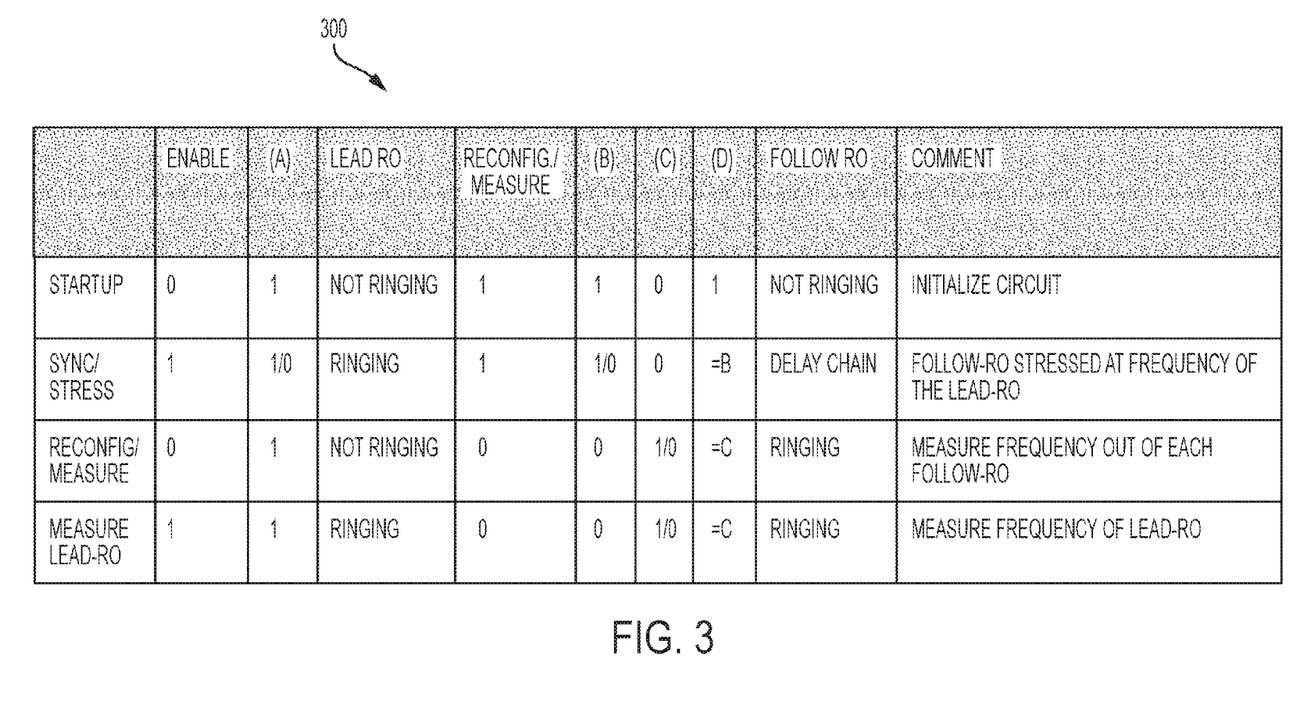
FIG. 3 depicts a truth table illustrating an operating methodology of the system shown in FIG. 2.

The operation of system 200, and more specifically the operation of the sync/stress phase, the reconfigure phase and the measure phase will now be described with reference to elements shown in FIG. 2 and a truth table 300 shown in FIG. 3. At startup, the sync/stress/enable signal is set to zero (0), which initializes system 200 and sets A, B, C, D to the values shown in FIG. 3 such that lead-RO 230 and first and second reconfigurable delay chains 140A and 160A are not ringing (i.e., not oscillating). In the sync/stress phase, enable is set to one (1), which synchronizes first frequency out 142A and second frequency out 162A to sync/stress frequency out 232 (both the frequency and the duty cycle are matched) and sets A, B, C, D to the values shown. In the sync/stress phase, lead-RO 230 is ringing (i.e., oscillating) and first and second reconfigurable delay chains 140A, 160A are configured as delay chains. In the reconfigure/measure phase, lead-RO 230 is not ringing (i.e., not oscillating), first and second reconfigurable delay chains 140A, 160A are configured as follow-ROs and first frequency out 142A and second frequency out 162A are measured. For embodiments wherein lead-RO 230 is made of delay components similar to those of first and second reconfigurable delay chains 140A, 160A, frequency changes in lead-RO 230 may also be measured in order to determine the HCI degradation in lead-RO 230.

Figure 4:
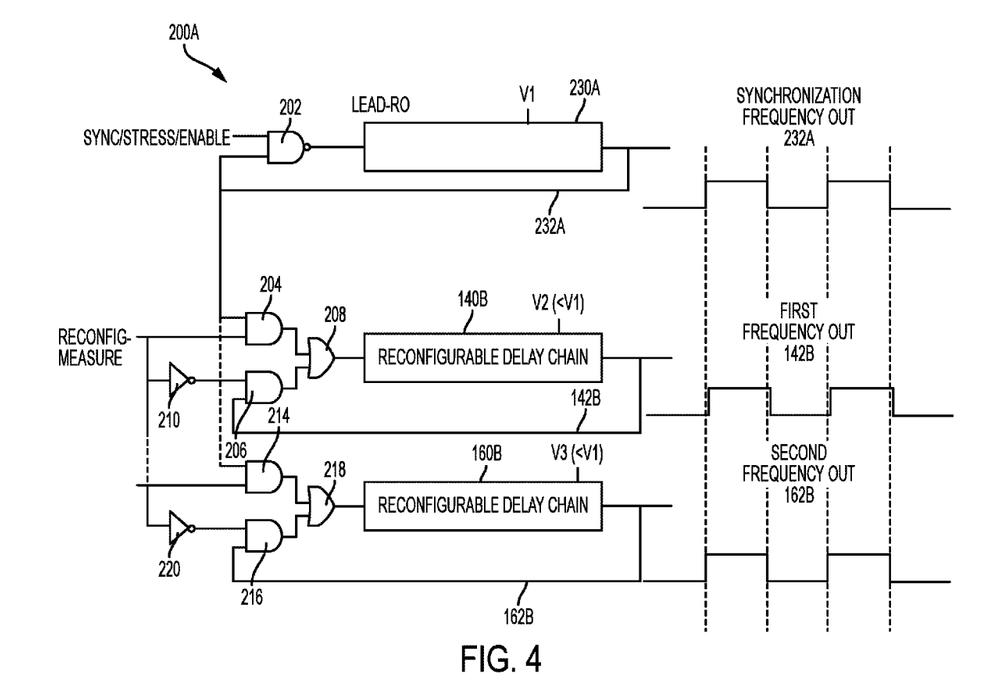
FIG. 4 depicts the system shown in FIG. 2 configured for voltage acceleration stress-and-measure testing sequences according to one or more embodiments.
Figure 5:
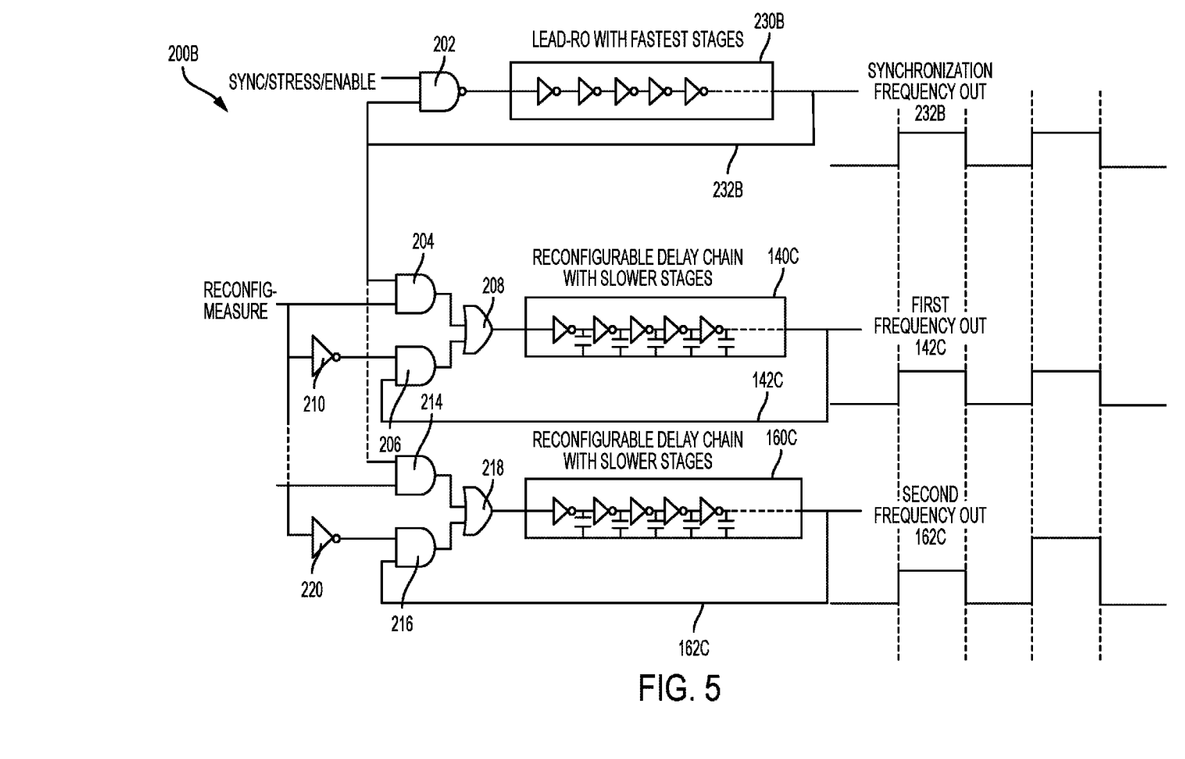
FIG. 5 depicts the system shown in FIG. 2 configured for capacitive loading stress-and-measure testing sequences according to one or more embodiments.
Figure 6:
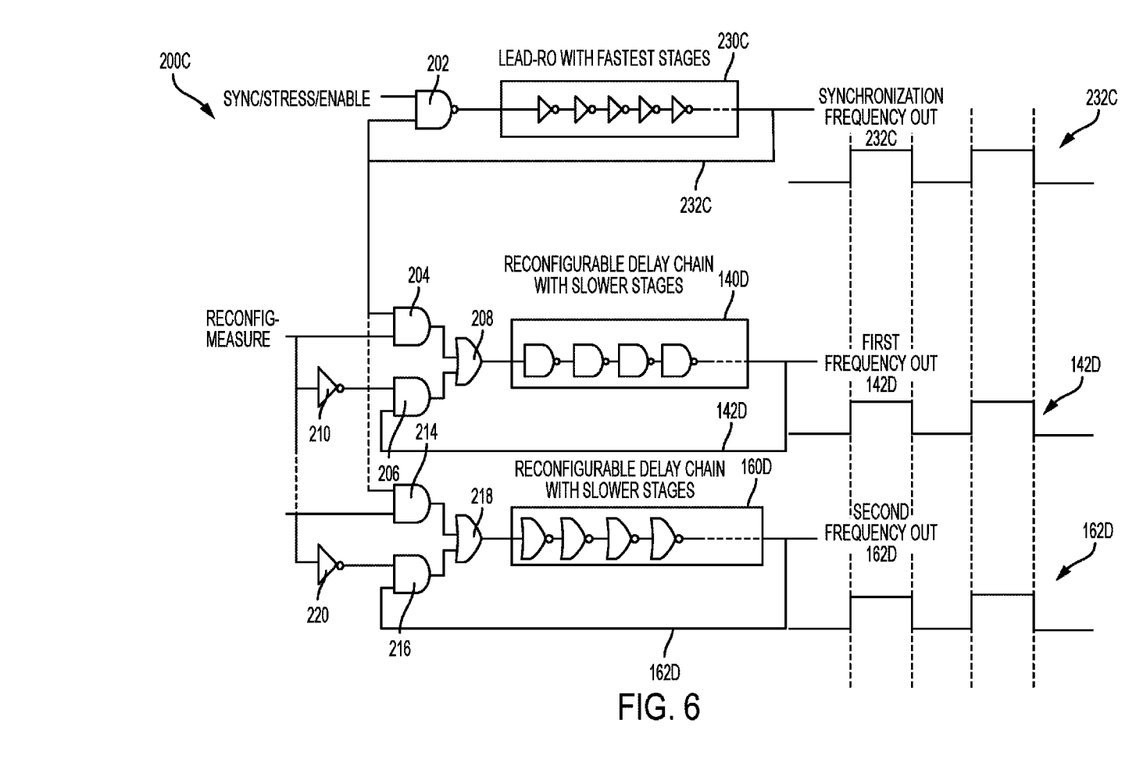
FIG. 6 depicts the system shown in FIG. 2, wherein downstream reconfigurable delay chains of the system are formed from different logic gates according to one or more embodiments.

FIGS. 4, 5 and 6 depict systems 200A, 200B, 200C respectively. System 200A shown in FIG. 4 is substantially the same as system 200 shown in FIG. 2 except in system 200A HCI degradation is accelerated by applying varying voltage magnitudes (V1, V2, V3) to lead-RO 230B, first reconfigurable delay chain 140B and second reconfigurable delay chain 160B. System 200B shown in FIG. 5 is substantially the same as system 200 shown in FIG. 2 except in system 200B HCI degradation is accelerated by designing and fabricating varying capacitive loads between delay stages of first reconfigurable delay chain 140C and second reconfigurable delay chain 160C. System 200C shown in FIG. 6 is substantially the same as system 200 shown in FIG. 2 except in system 200C the logic elements (e.g., NANDs) that form the delay stages of first reconfigurable delay chain 140D are different from the logic elements (e.g., NORs) that form second reconfigurable delay chain 160D.

Systems 200A, 200B, 200C shown in FIGS. 4, 5 and 6, respectively, are examples of acceleration factors that may be applied to the lead and/or follow ring oscillators during the stress phase to enhance the HCI isolation and/or measurement. For example, if voltage acceleration is desired, the lead ring oscillator voltage is set at a higher magnitude than the follow ring oscillators as shown by system 200A in FIG. 4. If capacitive loading is desired, the lead ring oscillator has the lowest inter-stage capacitance as shown by system 200B in FIG. 6. Also, different logic elements can be used in the first and second reconfigurable delay chains 140D, 160D to allow the evaluation of how of HCE degradation is impacted by the choice of delay chain logic elements. Elevated temperatures may also be used as an acceleration factor.

Figure 7:
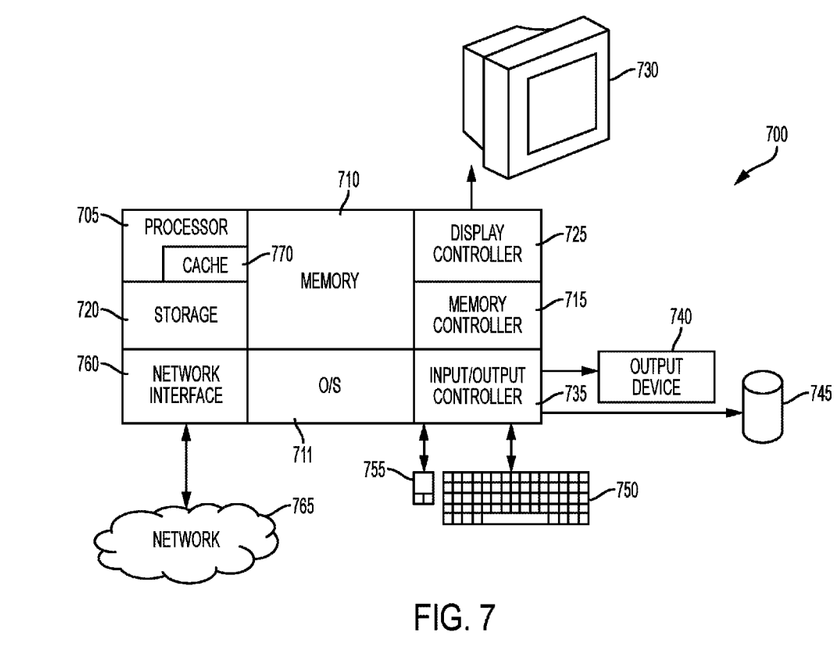
FIG. 7 depicts a computer system capable of implementing one or more aspects of the present disclosure according to one or more embodiments.

FIG. 7 depicts a computer system 700 capable of implementing one or more aspects of the present disclosure. Specifically, computer system 700 is capable of implementing at least performance degradation estimating component 180 (shown in FIG. 1) and controller 110 (shown in FIG. 1). The processing described herein may be implemented in hardware, software (e.g., firmware), or a combination thereof. In an exemplary embodiment, the methods described may be implemented, at least in part, in hardware and may be part of the microprocessor of a special or general-purpose computer system 700, such as a personal computer, workstation, minicomputer or mainframe computer.

In an exemplary embodiment, as shown in FIG. 7, computer system 700 includes a processor 705, memory 710 coupled to a memory controller 715, and one or more input devices 745 and/or output devices 740, such as peripherals, that are communicatively coupled via a local I/O controller 735. These devices 740 and 745 may include, for example, a printer, a scanner, a microphone, and the like. A conventional keyboard 750 and mouse 755 may be coupled to I/O controller 735. I/O controller 735 may be, for example, one or more buses or other wired or wireless connections, as are known in the art. I/O controller 735 may have additional elements, which are omitted for simplicity, such as controllers, buffers (caches), drivers, repeaters, and receivers, to enable communications.

I/O devices 740, 745 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

Processor 705 is a hardware device for executing hardware instructions or software, particularly those stored in memory 710. Processor 705 may be a custom made or commercially available processor, a central processing unit (CPU), an auxiliary processor among several processors associated with computer system 700, a semiconductor based microprocessor (in the form of a microchip or chip set), a macroprocessor, or other device for executing instructions. Processor 705 includes a cache 770, which may include, but is not limited to, an instruction cache to speed up executable instruction fetch, a data cache to speed up data fetch and store, and a translation lookaside buffer (TLB) used to speed up virtual-to-physical address translation for both executable instructions and data. Cache 770 may be organized as a hierarchy of more cache levels (L1, L2, etc.).

Memory 710 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, memory 710 may incorporate electronic, magnetic, optical, or other types of storage media. Note that memory 710 may have a distributed architecture, where various components are situated remote from one another but may be accessed by processor 705.

The instructions in memory 710 may include one or more separate programs, each of which comprises an ordered listing of executable instructions for implementing logical functions. In the example of FIG. 7, the instructions in memory 710 include a suitable operating system (OS) 711. The operating system 711 essentially may control the execution of other computer programs and provides scheduling, input-output control, file and data management, memory management, and communication control and related services.

Additional data, including, for example, instructions for processor 705 or other retrievable information, may be stored in storage 720, which may be a storage device such as a hard disk drive or solid state drive. The stored instructions in memory 710 or in storage 720 may include those enabling the processor to execute one or more aspects of the systems and methods of the present disclosure.

Computer system 700 may further include a display controller 725 coupled to a display 730. In an exemplary embodiment, computer system 700 may further include a network interface 760 for coupling to a network 765. Network 765 may be an IP-based network for communication between the computer system 700 and an external server, client and the like via a broadband connection. Network 765 transmits and receives data between computer system 700 and external systems. In an exemplary embodiment, network 765 may be a managed IP network administered by a service provider. Network 765 may be implemented in a wireless fashion, e.g., using wireless protocols and technologies, such as WiFi, WiMax, etc. Network 765 may also be a packet-switched network such as a local area network, wide area network, metropolitan area network, the Internet, or other similar type of network environment. Network 765 may be a fixed wireless network, a wireless local area network (LAN), a wireless wide area network (WAN) a personal area network (PAN), a virtual private network (VPN), intranet or other suitable network system and may include equipment for receiving and transmitting signals.

Thus, it can be seen from the foregoing detailed description that the present disclosure provides systems and methodologies that efficiently and effectively isolate HCI degradation from BTI degradation and other aging mechanisms using the disclosed stress-and-measure test sequence that synchronizes one or more ring oscillator circuits to a desired number of switching events independent of the stress protocol used to measure HCI degradation, and independent of the intrinsic frequency of each ring oscillator circuit. In one or more embodiments, during a sync/stress phase, a fast lead ring oscillator drives a signal through one or several downstream delay chains composed of slower stages to thereby stress the downstream delay chains. Because they are delay chains, the downstream delay chains are not limited in frequency, and each stage of the downstream delay chains experiences the same duty cycle as the fast lead ring oscillator. Accordingly, the BTI degradation is common to the lead ring oscillator and the downstream delay chains.

To measure the BTI degradation, a reconfiguration phase and a measure phase are initiated, wherein the downstream delay chains are configured as downstream ring oscillators and their frequencies are measured. Measurements can then proceeds using a conventional stress-measure-stress-measure sequence. In one or more embodiments, the lead ring oscillator and downstream delay chains are arranged for speed according to acceleration factors. If voltage acceleration is desired, the lead ring oscillator has a higher voltage applied than the downstream ring oscillators. If capacitive loading is desired, the lead ring oscillator has the lowest inter-stage capacitance. Different logic elements can be used to form the delay stages in downstream ring oscillators, which allows an evaluation of how different logic element designs in the downstream ring oscillators impact HCI degradation.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A system for synchronizing switching events, the system comprising:
   a controller;
   a clock generator communicatively coupled to the controller; and
   a delay chain communicatively coupled to the controller;
   wherein the delay chain is configured to perform a plurality of delay chain switching events in response to an input to the delay chain;
   wherein the controller is configured to initiate a synchronization phase comprising:
   enabling the clock generator to provide as an input to the delay chain a clock generator output at a synchronization frequency, wherein the clock generator output passing through the delay chain synchronizes the plurality of delay chain switching events to occur at the synchronization frequency resulting in a frequency the delay chain being synchronized to the synchronization frequency of the clock generator output; and
   a synchronization/stress phase comprising further enabling the clock generator to provide to the delay chain the clock generator output for a duration that is sufficient to stress the delay chain;
   wherein the controller is further configured to initiate a reconfigure phase comprising reconfiguring the delay chain to operate as a ring oscillator.

2. The system of claim 1, wherein, prior to the synchronization phase, a frequency of the plurality of delay chain switching events is less than the synchronization frequency.

3. The system of claim 1, wherein the clock generator output passing through the delay chain synchronizes a duty cycle of the plurality of delay chain switching events to substantially equal a duty cycle of the clock generator output resulting in a duty cycle of the first delay chain being synchronized to the duty cycle of the clock generator output.

4. The system of claim 1 further comprising:
a second delay chain communicatively coupled to the controller;
wherein the second delay chain is configured to perform a plurality of second delay chain switching events in response to an input to the second delay chain;
wherein the synchronization phase further comprises:
enabling the clock generator to provide as an input to the second delay chain the clock generator output at the synchronization frequency, wherein the clock generator output passing through the second delay chain synchronizes the plurality of second delay chain switching events to occur at the synchronization frequency resulting in an output of the second delay chain being synchronized to the synchronization frequency of the clock generator output.

5. The system of claim 4, wherein, prior to the synchronization phase, a frequency of the plurality of second delay chain switching events is less than the synchronization frequency.

6. The system of claim 1, wherein:
reconfiguring the delay chain to operate as the ring oscillator comprises coupling the output of the delay chain to an input of the delay chain;
the ring oscillator is configured to perform a plurality of ring oscillator switching events at a ring oscillator frequency that is independent of the synchronization frequency.

7. A system for synchronizing switching events, the system comprising:
a controller;
a clock generator communicatively coupled to the controller; and
a delay chain communicatively coupled to the controller;
wherein the delay chain is configured to perform a plurality of first delay chain switching events in response to an input to the delay chain;
wherein the controller is configured to initiate a synchronization phase comprising:
enabling the clock generator to provide as an input to the delay chain a clock generator output at a synchronization frequency and a synchronization duty cycle, wherein the clock generator output passing through the delay chain synchronizes the plurality of delay chain switching events to occur at the synchronization frequency and the synchronization duty cycle resulting in an output frequency of the delay chain and an output duty cycle of the delay chain being synchronized to the synchronization frequency and the synchronization duty cycle of the clock generator output; and
a synchronization/stress phase comprising further enabling the clock generator to provide to the delay chain the clock generator output for a duration that is sufficient to stress the delay chain;
wherein the controller is further configured to initiate a reconfigure phase comprising reconfiguring the delay chain to operate as a ring oscillator.

8. The system of claim 7 further comprising:
a second delay chain communicatively coupled to the controller;
wherein the second delay chain is configured to perform a plurality of second delay chain switching events in response to an input the second delay chain;
wherein the synchronization phase further comprises:
enabling the clock generator to provide as an input to the second delay chain the clock generator output at the synchronization frequency and the synchronization duty cycle, wherein the clock generator output passing through the second delay chain synchronizes the plurality of second delay chain switching events to occur at the synchronization frequency and the synchronization duty cycle resulting in an output frequency of the second delay chain and an output duty cycle of the second delay chain being synchronized to the synchronization frequency and the synchronization duty cycle of the clock generator output.

9. The system of claim 7, wherein:
the ring oscillator is configured to perform a plurality of ring oscillator switching events at a ring oscillator frequency and a ring oscillator duty cycle that are independent of the synchronization frequency and the synchronization duty cycle.

10. The system of claim 9 further comprising an electronic measuring component communicatively coupled to the ring oscillator to receive and measure the output of the ring oscillator.

11. A system for synchronizing switching events, the system comprising:
a controller;
a clock generator communicatively coupled to the controller; and
a delay chain communicatively coupled to the controller;
wherein the delay chain is configured to perform a plurality of delay chain switching events in response to an input to the delay chain;
wherein the controller is configured to initiate a synchronization/stress phase comprising:
enabling the clock generator to provide as an input to the delay chain a clock generator output at a synchronization frequency and a synchronization duty cycle, wherein the clock generator output passing through the delay chain synchronizes the plurality of delay chain switching events to occur at the synchronization frequency and the synchronization duty cycle resulting in an output frequency of the delay chain and an output duty cycle of the delay chain being synchronized to the synchronization frequency of the clock generator output and the synchronization duty cycle of the clock generator output, wherein the clock generator output is provided to the delay chain for a duration that is sufficient to stress the delay chain;
wherein the controller is further configured to initiate a reconfigure phase comprising:
reconfiguring the delay chain to operate as a ring oscillator;
wherein, prior to the synchronization phase, a frequency of the plurality of delay chain switching events is less than the synchronization frequency.

12. The system of claim 11 further comprising:
a second delay chain communicatively coupled to the controller;
wherein the second delay chain is configured to perform a plurality of second delay chain switching events in response to an input to the second delay chain;

wherein the synchronization/stress phase further comprises:
enabling the clock generator to provide as an input to the second delay chain the clock generator output at the synchronization frequency and the synchronization duty cycle, wherein the clock generator output passing through the second delay chain synchronizes the plurality of second delay chain switching events to occur at the synchronization frequency and the synchronization duty cycle resulting in an output frequency of the second delay chain and an output duty cycle of the second delay chain being synchronized to the synchronization frequency of the clock generator output and the synchronization duty cycle of the clock generator output, wherein the clock generator output is provided to the second delay chain for a duration that is sufficient to stress the second delay chain.

13. The system of claim 11, wherein:
the ring oscillator is configured to perform a plurality of ring oscillator switching events at a ring oscillator frequency and a ring oscillator duty cycle that are independent of the synchronization frequency and the synchronization duty cycle.

14. The system of claim 11, wherein:
a first stress acceleration voltage is applied to the clock generator;
a second stress acceleration voltage is applied to the delay chain; and
the second stress acceleration voltage is less than the first stress acceleration voltage.

15. The system of claim 11, wherein an intrinsic capacitance of the clock generator is less than an intrinsic capacitance of the delay chain.

16. The system of claim 12, wherein:
the delay chain comprises a first type of logic element; and
the second delay chain comprises a second type of logic element;
wherein the first type is different from the second type.

17. The system of claim 11, wherein:
the controller comprises a control circuit formed from logic elements; and
the clock generator comprises a lead ring oscillator.

18. A method for synchronizing switching events, the method comprising:
initiating, using a controller, a synchronization phase comprising:
enabling a clock generator to provide as an input to a delay chain a clock generator output at a synchronization frequency, wherein the clock generator output passing through the delay chain synchronizes a plurality of first delay chain switching events to occur at the synchronization frequency resulting in a frequency of an output of the delay chain being synchronized to the synchronization frequency of the clock generator output; and
initiating, using the controller, a reconfigure phase comprising reconfiguring the delay chain to operate as a ring oscillator;
wherein reconfiguring the delay chain to operate as the ring oscillator comprises coupling the output of the delay chain to an input of the delay chain;
wherein the ring oscillator is configured to perform a plurality of ring oscillator switching events at a ring oscillator frequency that is independent of the synchronization frequency.

19. The method of claim 18, wherein the synchronization phase further comprises:
enabling the clock generator to provide as an input to a second delay chain the clock generator output at the synchronization frequency, wherein the clock generator output passing through the second delay chain synchronizes a plurality of second delay chain switching events to occur at the synchronization frequency resulting in an output of the second delay chain being synchronized to the synchronization frequency of the clock generator output.

20. The method of claim 19, wherein, prior to the synchronization phase, a frequency of the plurality of second delay chain switching events is less than the synchronization frequency.

21. The method of claim 18, wherein, prior to the synchronization phase, a frequency of the plurality of delay chain switching events is less than the synchronization frequency.

22. The method of claim 18, wherein the clock generator output passing through the delay chain synchronizes a duty cycle of the plurality of delay chain switching events to substantially equal a duty cycle of the clock generator output resulting in a duty cycle of the output of the delay chain being synchronized to the duty cycle of the clock generator output.

* * * * *